US006740536B2

(12) United States Patent
Dodd et al.

(10) Patent No.: US 6,740,536 B2
(45) Date of Patent: May 25, 2004

(54) DEVICES AND METHODS FOR INTEGRATED CIRCUIT MANUFACTURING

(75) Inventors: Simon Dodd, Corvalis, OR (US); Frank Randolph Bryant, Denton, TX (US); Paul I. Mikulan, Farmers Branch, TX (US)

(73) Assignee: Hewlett-Packard Develpment Corporation, L.P., Houston, TX (US)

( * ) Notice: Subject to any disclaimer, the term of this patent is extended or adjusted under 35 U.S.C. 154(b) by 0 days.

(21) Appl. No.: 10/055,161

(22) Filed: Oct. 26, 2001

(65) Prior Publication Data

US 2003/0080362 A1 May 1, 2003

(51) Int. Cl.[7] .............................................. H01L 21/00
(52) U.S. Cl. .............................................. 438/21; 347/1
(58) Field of Search ................................ 438/21; 347/1

(56) References Cited

U.S. PATENT DOCUMENTS

| | | | | | |
|---|---|---|---|---|---|
| 5,322,811 | A | * | 6/1994 | Komuro et al. | 438/21 |
| 5,448,273 | A | | 9/1995 | Klein et al. | 347/64 |
| 5,998,288 | A | * | 12/1999 | Gardner et al. | 438/589 |
| 6,039,438 | A | | 3/2000 | Beerling | 347/63 |
| 6,284,147 | B1 | | 9/2001 | Silverbrook | 216/27 |
| 6,286,939 | B1 | | 9/2001 | Hindman et al. | 347/63 |
| 6,290,337 | B1 | | 9/2001 | Radke | 347/65 |
| 6,406,740 | B1 | | 6/2002 | Komuro | |
| 6,474,780 | B1 | * | 11/2002 | Kubota et al. | 347/45 |

* cited by examiner

*Primary Examiner*—Jasmine J. B. Clark
*Assistant Examiner*—Christopher Lattin

(57) ABSTRACT

Integrated circuits and methods for producing them are provided. In particular, integrated circuits with shielding elements are provided.

6 Claims, 5 Drawing Sheets

DEVICES AND METHODS FOR INTEGRATED CIRCUIT MANUFACTURING

BACKGROUND OF THE INVENTION

Many modern devices contain electronic components employing integrated circuits composed of multiple layers deposited on a substrate. The multiple layers, combined with the usually surficial semi-conducting properties of the substrate, provide different electrical and physical properties, and their orientations relative to one another provide circuit logic.

The process of constructing a multilayer integrated circuit can comprise numerous steps. Often, a semiconducting bulk or "die" is used as a starting point. This die, often Silicon crystal, but sometimes Gallium Arsenide, Germanium or another semiconducting substance, is then "doped" with small amounts of impurities to increase conductance. Different surface regions of the die may be oppositely (in the sense of charge donating or accepting impurities) doped, to create the underlying elements of a transistor. The spatial arrangement of doped regions on the surface may be accomplished through the masking of doping agents or the post-doping etching of a die surface layer.

Numerous other layers may be applied to such an integrated circuit, including gate electrode layers for transistor activation, conducting layers to carry electric signals, insulating layers to isolate components or provide resistance, passivation layers to chemcially protect components, and physical layers to give a circuit desired mechanical properties. These layers may have different horizontal arrangements, and can generally be added through processes of deposition, masking and/or etching.

At times, however, some of the steps to produce a multi-layered integrated circuit can interfere with components created in other steps. For example, chemical etching steps may use electrochemical reactions that interfere with the electrical properties of other layers, or cause chemical decomposition in other layers. These side-effects can be difficult to design around, requiring otherwise unnecessary manufacturing steps and generally increasing costs. The sources of these side effects are often unknown.

BRIEF SUMMARY OF THE INVENTION

One embodiment of the invention relates to an integrated circuit comprising a shielding element. Other embodiments of the invention will be apparent from the specification, including the claims.

BRIEF DESCRIPTION OF THE DRAWINGS

The invention is illustrated by way of example and not limitation in the accompanying drawings, in which like references indicate similar elements and in which.

DETAILED DESCRIPTION OF THE INVENTION

Figure 1:
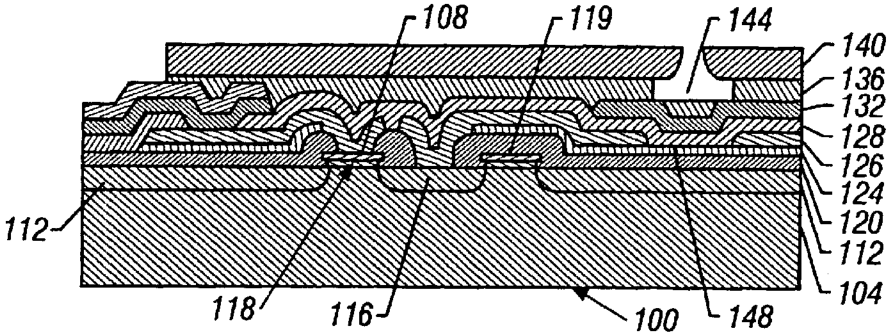
FIG. 1 is one embodiment of a cross section of an exemplary integrated circuit usable in an inkjet print head.

Generally, improved integrated circuits and methods for manufacturing them are described. In the following description, for purposes of explanation, numerous specific details are set forth in order to provide a thorough understanding of exemplary embodiments. It will be evident in certain instances, however, to one skilled in the art that the present invention may be practiced without these specific details.

The semiconductor embodiments and methods for making them of the present invention are applicable to a broad class of technologies and materials. The present description, although it makes use of examples using Silicon substrates, is not intended to be limited to devices or methods employing Silicon substrates, but rather is applicable to other materials that can be used to form integrated circuits, including but not limited to Gallium Arsenide and Germanium. Further, although some of the device embodiments of the invention have been shown to include specific n and p type regions, it should be clearly understood that the teachings herein are equally applicable to semiconductor devices in which the conductivites of the various regions have been reversed, to provide the dual of the illustrated device.

In addition, some of the Figures have been exaggerated in order to usefully convey the appropriate information. It is not unusual, for example, for multilayer integrated circuits to be constructed upon a substrate that is many times thicker than the layers disposed on top of the substrate. These upper layers, if drawn to scale relative to the underlying substrate or one another, might be too thin to be visible within the circuit, and have therefore at times been disproportionately displayed. Moreover, although the device embodiments are herein illustrated in two dimensions, it should be understood that these illustrations represent only a portion of a three dimensional structure constituting the device. With reference to the integrated circuit embodiments of the figures, the direction "up", as reflected in prepositions "above", "upon", "over", etc., will refer to the direction in which deposition of layers normally occurs (away from the substrate die), although this may not be the final orientation in which an integrated circuit is actually used.

Numerous types of integrated circuits are manufactured for a variety of uses. Many of these circuits require multilayer processing that involves the application of a substance in a layer to a substrate, wherein the substance applied is spatially arranged by means of a mask or etching process. The steps of deposition, masking and/or etching can be repeated several times during the construction of a complete integrated circuit.

Often, the processing of a layer of an integrated circuit can affect layers that are deposited before or after the layer being processed. For example, in some circuits, etching procedures will be used to cut through several layers at once, touching multiple chemical substances and electrical environments in the process. As another example, the arrangement of substances with particular chemical or electrical properties in lower layers can affect the deposition characteristics, bonding or electrical characteristics of a layer later deposited overhead.

The embodiments of the present invention seek to minimize these difficulties through the use of shielding elements that minimize the interaction between layers or within layers during processing. It is anticipated that these shielding elements will be useful in a variety of applications wherever multiple process steps are required to build an integrated circuit.

Examples of multi-layer integrated circuit applications can be found in the field of fluid ejection devices. Certain embodiments of fluid ejection devices can be integrated into a single circuit. Such embodiments, including many forms of ink jet print heads, are often designed as multilayer integrated circuits, with circuit logic in lower layers controlling inkjet firing mechanisms in the upper layers. In this regard, inkjet print heads represent a useful exemplary system for the discussion of shielding elements in multilayer integrated circuits. Inkjet print heads are typically found in ink jet cartridges, and are useful in printers usable in computer systems, particularly with home users or where inexpensive color or special application printing is required.

FIG. 1 is a cross section of an exemplary integrated circuit 100 usable in an inkjet print head. FIG. 1 has a die 104, upon which is a gate 108, operating between source regions 112 and drain regions 116. Circuit 100 has a gate oxide layer 118, a gate electrode layer 119 that is preferably a Polycrystalline Silicon or "Poly" layer as in the embodiment in FIG. 1, a dielectric layer 120, a resistive/conductive layer 124, a conductive layer 126, a passivation layer 128, a cavitation layer 132, a fluid barrier layer 136, and an orifice plate 140. In certain embodiments, fluid barrier layer 136 forms an integral layer with orifice plate 140. Integrated circuit 100 also has an ejection chamber 144 and a firing element 148. An integrated circuit 100 as in FIG. 1 usually has a further conductive layer disposed above cavitation layer 132, but such a layer is not drawn in FIG. 1.

As in FIG. 1, integrated circuit 100 comprises an N-MOS transistor formed by the interaction between p-type Silicon die 104, n doped source regions 112 and drain regions 116, and the gate 108. The gate 108 is comprised of a gate oxide layer 118 disposed beneath a gate electrode layer 119.

The logic elements of circuit 100 control a firing element 148, which comprises a section of resistive/conductive layer 124 disposed directly underneath passivation layer 128, where no conductive layer 126 exists. The heating of firing element 148 causes ink in ejection chamber 144 to expand rapidly and exit ejection chamber 144 during the printing process.

Several layers provide physical protection for the integrated circuit 100 during printing. Passivation layer 128 serves to chemically isolate components from the corrosive ink in ejection chamber 144 and parts of fluid barrier layer 136. Passivation layers are often, but not by necessity, composed of Silicon-Nitride, Silicon-Carbide, or a combination of the two. Cavitation layer 132 is preferably composed of a relatively inert, resilient substance with good ability to absorb the shock of collapsing ink bubbles upon firing. Tantalum is often used to provide such shock absorbing properties in a cavitation layer, although other substances with similar properties could be effectively used. Dielectric layer 120 is used to thermally isolate the firing element 148, and therefore preferably has a thickness of at least 2000 Angstroms, with 6000 to 12,000 Angstroms being more typical.

The integrated circuit 100 as in FIG. 1 lacks a relatively thick Field Oxide layer that is often used to construct multilayer integrated circuits. As is known in the art, it is possible to construct a transistor by first doping the substrate, then providing a field oxide layer using an "island mask", further providing transistor gates by growing a gate oxide layer and depositing a Poly gate electrode layer using a "Poly/Gate" mask, and then oppositely doping those areas which are not covered by the field oxide region, thus defining p and n doped regions. The field oxide in such a process thus functions as a masking agent and as an electrical insulator isolating logic components from one another where necessary. In FIG. 1, however, integrated circuit 100 was constructed without the island mask process and the concomitant field oxide layer.

Figure 2:
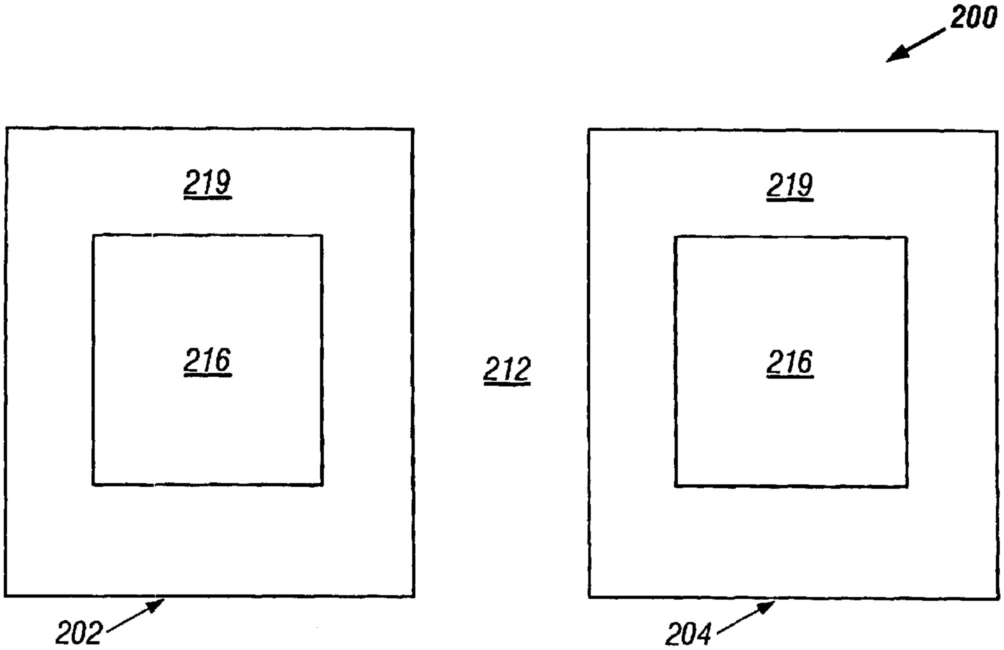
FIG. 2 is one embodiment of a horizontal section of an integrated circuit.

In order to forego the field oxide layer, isolated components in an integrated circuit can be separated using their own transistor gates. FIG. 2 is an exemplary plan view layout of a transistor constructed without an island mask process. FIG. 2 is a horizontal section of an integrated circuit 200, two transistors 202 and 204, a source potential region 212, drain potential regions 216 (referred to with the same reference numeral, although not electrically connected), and gate electrode layer regions 219. In FIG. 2, the source potential region 212 and the drain potential region 216 are both drawn as n-doped regions. The gate electrode layer regions 219 cover a thin gate oxide region (not shown), which in turn covers the p-type Silicon of the die.

The transistors 202 and 204 are activated by signals to the gate electrode region 219, creating an increase in boundary conductance in the p type regions immediately below the gate electrode layer region 219, effectively connecting source region 212 with the respective drain region 216. The source region 212 (the n-doped region) extends over most of the surface of this layer of integrated circuit 200, thus providing a charge carrying conduit. Transistors 202 and 204 are, however, isolated from one another by the box structure of gate electrode layer regions 219 and the underlying gate oxide and p type die regions (not shown).

The transistor layout in FIG. 2 has the advantage that an island mask step is not required in the manufacturing process, thus lowering costs and simplifying the manufacturing process. The layout in FIG. 2, however, creates a large area of charge carrying doped regions (the source region 212) where otherwise a layer of field oxide (or other insulator) would lie. This causes much of the lower surfaces of the integrated circuit 200 to be electrically connected.

Figure 3:
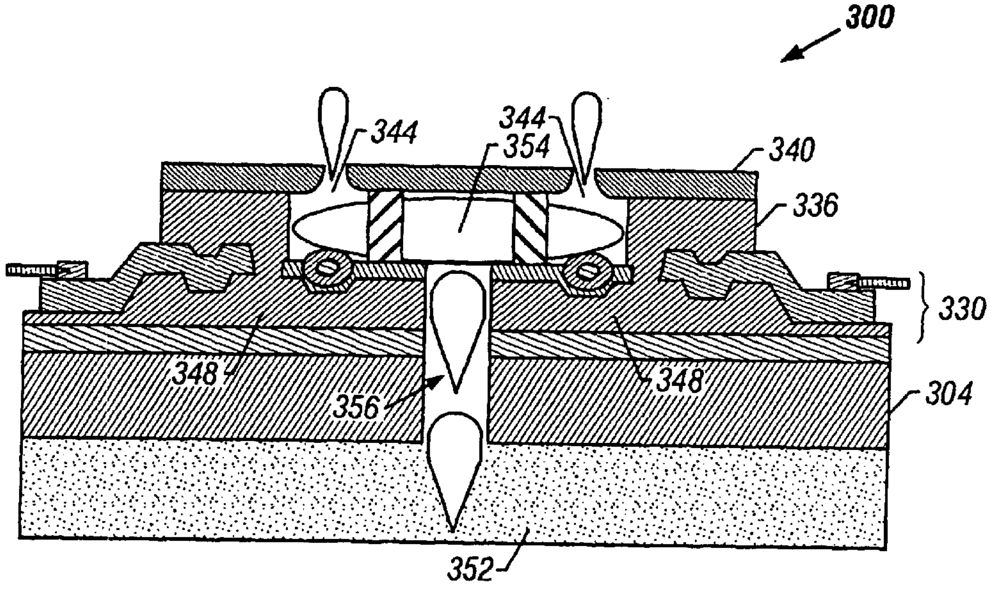
FIG. 3 is one embodiment of a cross section of an exemplary slot-fed print head.

It has been found that this electrical connectivity can interfere with later processing of layers in an integrated circuit design for a slot fed print head. A slot fed print head refers to a print head that feeds ink to its inkjet firing mechanisms by means of a slot drilled through the die, allowing ink to flow from an ink well into the inkjet firing chambers. FIG. 3 is a cross section of an exemplary slot-fed print head 300. FIG. 3 has a substrate or die 304, multiple layers 330 (with functionality similar to that described with reference to FIG. 1), a fluid barrier layer 336, an orifice plate 340, ink firing chambers 344, firing elements 348, an ink supply 352, an ink reservoir 354, and an ink slot 356.

The ink supply 352 provides ink to ink reservoir 354 by means of ink slot 356. Ink flows (generally under pressure) into ink reservoir 354 and is ejected by the heating of firing elements 348, through orifice plate 340, onto a (usually) paper receiving substrate.

The ink slot 356 extends throughout the thickness of the substrate 304 and multilayer complex 330 that forms the electrical components of the integrated circuit 300. The slot may be created in a variety of ways, but is usually accomplished by particulate drilling. This method accelerates abrasive particles at the underside of the die 304, chipping away pieces of the die 304 until a complete slot has been created.

Figure 4:
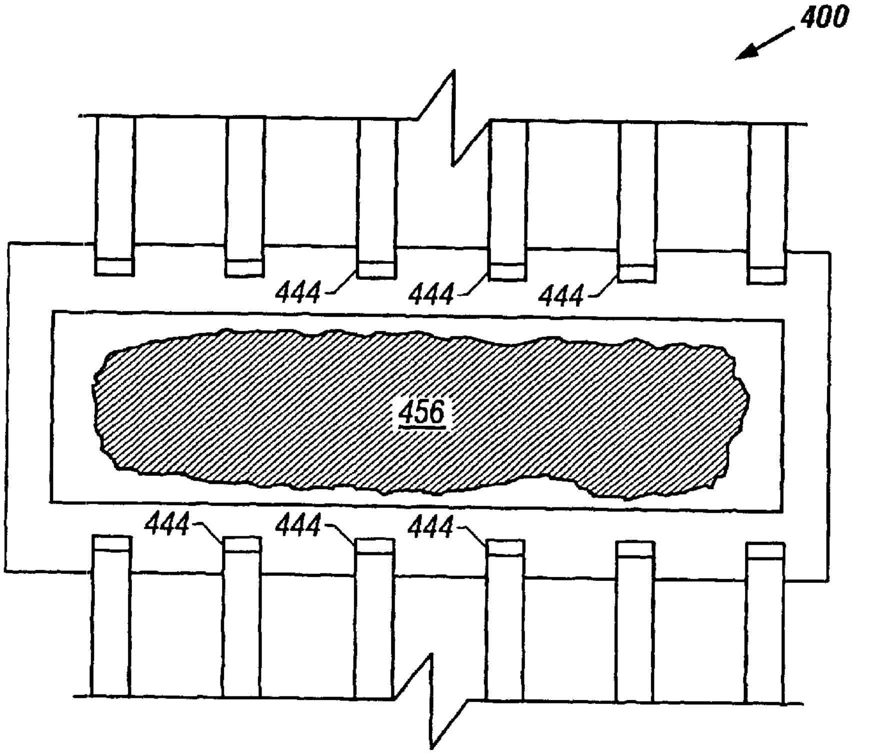
FIG. 4 is one embodiment of a plan view of a portion of an exemplary slot fed print head.

FIG. 4 is a plan view of a portion of an exemplary slot fed print head 400. The portion of print head 400 has an ink slot 456 bordered by inkjet firing chambers 444. An orifice plate, not shown here, would normally cover the ink slot and surrounding regions to prevent ink from escaping before being ejected from the firing chambers 444. The rough edges of ink slot 456 are caused by the drilling process, as abrasive particles used in the process impact the print head 400 and chip off small portions. The ink slot 456 allows ink to flow from a pen body (not visible), and then laterally into firing chambers 444 to be ejected by mechanisms previously described with reference to FIG. 1.

In forming a ink slot 456, it is often advantageous to pre-etch the substrate to guide the abrasive particle stream to the correct exit point. Because the drill usually proceeds from the underside of the die (where the delicate layering of the opposite side is usually not present), the point of exit, and the shape of the exit hole near such delicate layering are important factors to consider. To encourage the correct exit features, pre-etching of the die is often performed. Pre-etching can be conducted to cut substrate along defined crystal planes, resulting in cleaner edges and less damage to the print head from drill emergence.

Pre-etching can take a number of forms. Generally, the area in which the slot will be formed is left exposed during the multilayer masking process, meaning that when a print head is ready for pre-drill etching, all layers through which the slot extends have been deposited, masked and/or etched. Usually, the area of the slot has been masked out, so that the substrate remains exposed in this area through the upper layers.

Figure 5:
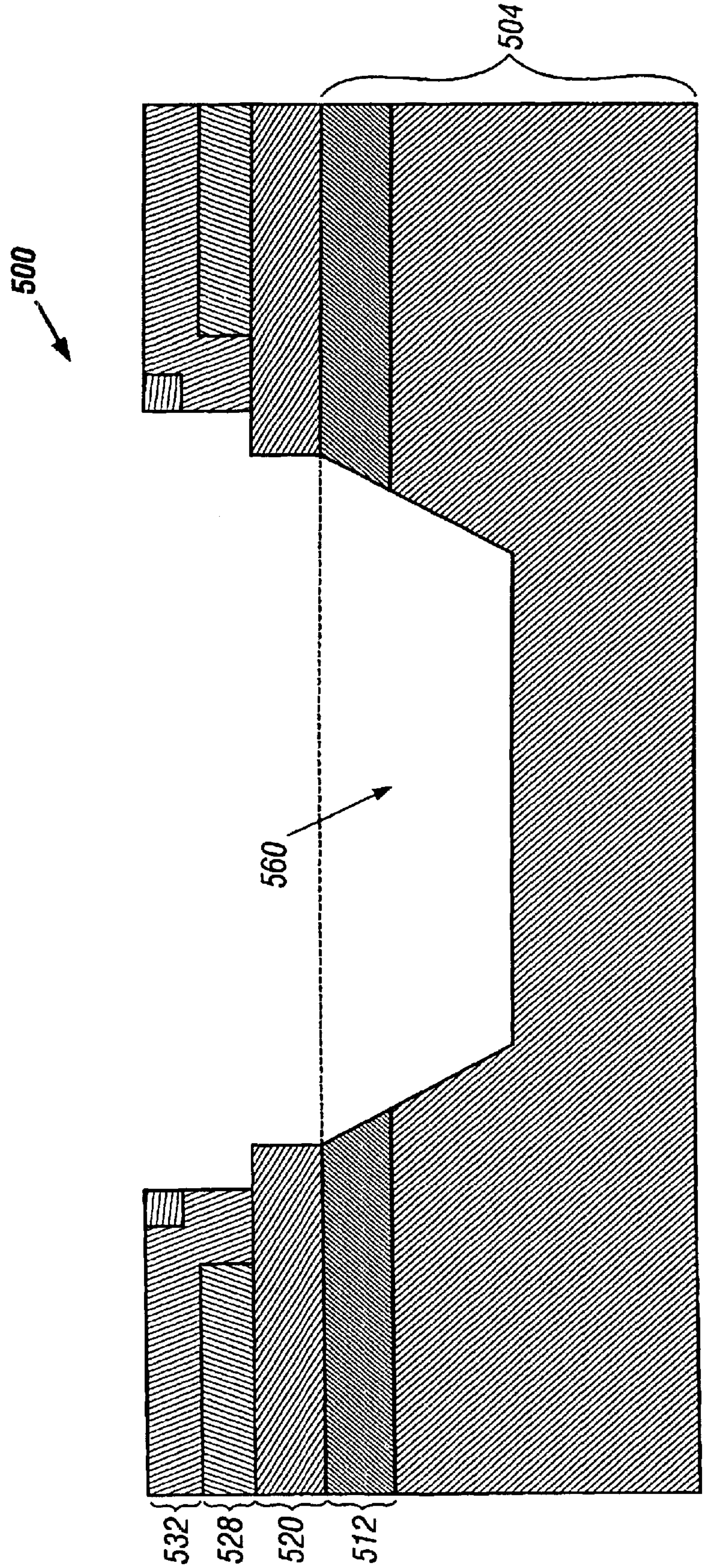
FIG. 5 is one embodiment of a cross section of an exemplary slot-fed print head through the slot area after a pre-drill Silicon etch has occurred, but before the drilling of the slot.

FIG. 5 is a cross section of an exemplary slot fed print head 500 through the slot area after a pre-drill Silicon etch has occurred, but before the drilling of the slot. Print head 500 has a substrate die 504, source regions 512, a dielectric layer 520, a passivation layer 528, a cavitation layer 532, and an ink slot pre-drill etch region 560.

A pre-drill Silicon etch will cut through a certain portion of the source regions 512 and the substrate die 504. This will leave one or more troughs 560 in the substrate itself, which will help guide the emerging drill stream during drilling. In the print head embodiment of FIG. 5, the ink slot pre-drill etch region 560 extends into the substrate to a depth of 40–60 microns, or about 10% of the total thickness of the substrate.

Silicon etching may be performed by a variety of means known in the art. One method comprises the application of Tetra-Methyl Ammonium Hydroxide (TMAH) to the exposed Silicon wafer, using Silicon Nitride or Oxide as a masking agent. TMAH can be used in conjunction with additives such as silicate. TMAH etches Silicon crystal along defined crystal planes and produces a relatively predictable etch pattern. The relationship between etch depth, temperature and time is also fairly well-characterized.

It has been found, however, that application of a Silicon etch to an integrated circuit with a layer stack such as that in FIG. 1 can induce delamination between previously deposited layers. More specifically, the contact between a Tantalum cavitation layer 532 and underlying layers is disturbed, resulting in partial delamination of the Tantalum layer. Delamination of the Tantalum (cavitation) layer 532 can result in poor product performance under the stress of repeated firing (ink ejection).

While the source of the Tantalum delamination is not known exactly, it is hypothesized that the Silicon etching reaction electrochemically induces charge buildup in the doped Silicon. Because (as in FIG. 2) the heavily doped regions 212 on the substrate comprise much of the surface of the substrate, the electrical effect of the Silicon etch reaction is communicated to other substrate areas that underlie higher layers in the system. Some of these layers and/or doped regions are in contact with the highly conductive ground buss, further propagating the effect.

It has been discovered that Tantalum delamination can be present whether or not the Tantalum itself is in contact with the ground buss. The effect appears strongest in regions that directly overlie regions where the doped substrate makes contact with the ground buss. Delamination also appears to be strongest in those wafers that lie outermost in a wafer lot during a batch etching process. The exact reason for Tantalum delamination is unknown.

A shielding element, as the term is used here, is a barrier composed of relatively low conductance material or lack of high conductance material, used to electrically isolate certain regions of a substrate, layer or structure within a circuit, with the purpose of protecting the substrate, layer or structure from damaging production side-effects. While a shielding element can add to the functionality of a circuit, its purpose is also to protect certain regions of the circuit during production.

Figure 6:
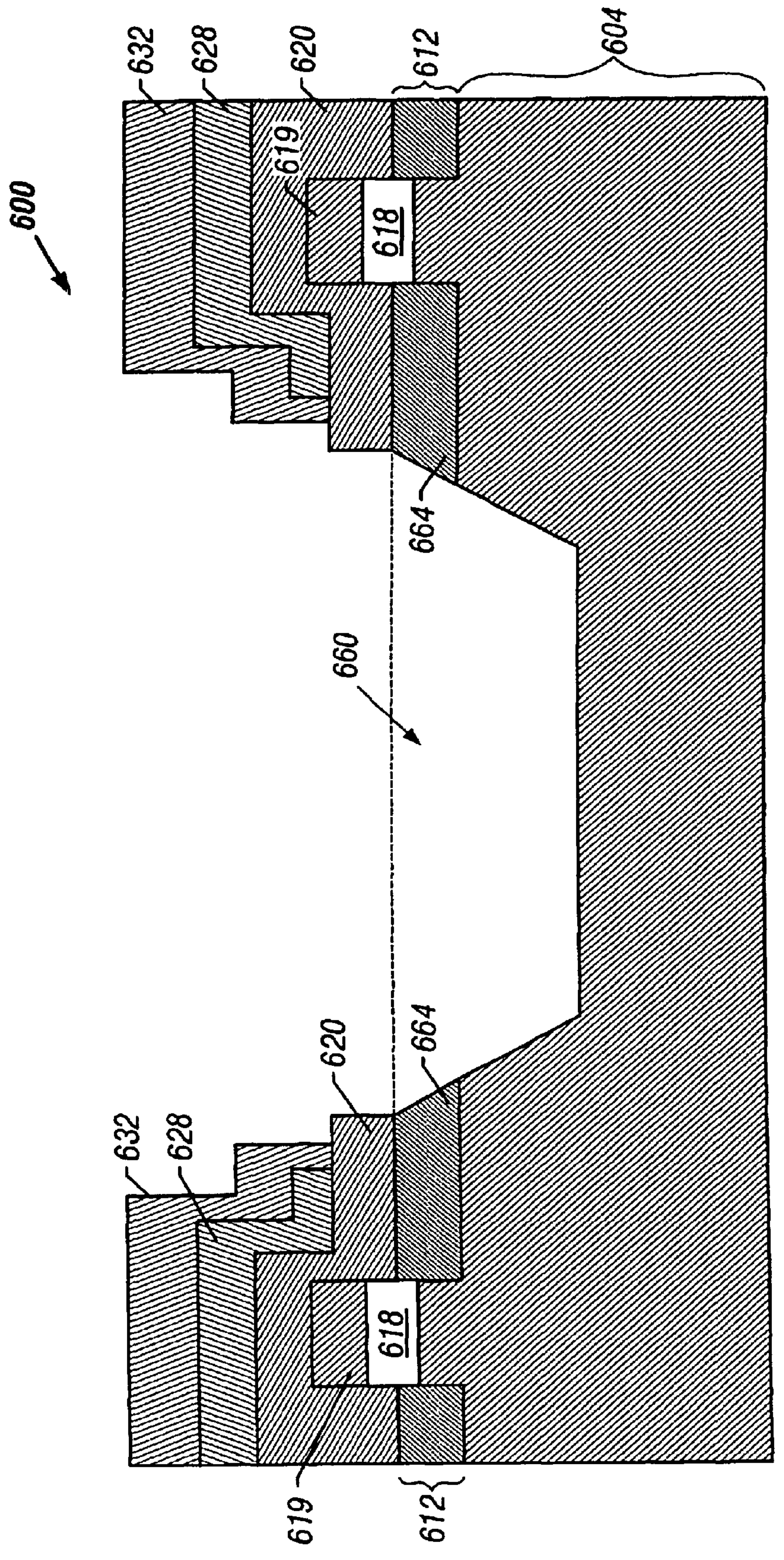
FIG. 6 is one embodiment of a cross section of an exemplary slot-fed print head 600 through the slot area after a pre-drill Silicon etch has occurred, but before the drilling of the slot.

FIG. 6 is a cross section similar to that in FIG. 5, that of an exemplary slot-fed print head 600 through the slot area after a pre-drill Silicon etch has occurred, but before the drilling of the slot. Print head 600 has a substrate die 604, external source regions 612, a gate electrode layer 619, a passivation layer 628, a cavitation layer 632, an ink slot pre-drill etch region 660, gate oxide (GOX) regions 618, dielectric regions 620, and interior n-doped Silicon regions 664.

The pre-drill slot etch takes place as before. However, in this embodiment the gate oxide regions 618 combined with the p-type Silicon underneath effectively shield external source regions 612 (comprising n-doped Silicon) from the interior n-doped Silicon region 664. Although not shown in the two-dimensional cross section of FIG. 6, the gate oxide regions 618 extend as a barrier around the entire pre-drill etch region 660. Thus, the Silicon etch reaction can take place in this region, without the interior n-doped Silicon regions 664 being in electrical contact with external source regions 612. It has been found that the use of a shielding element in this manner reduces delamination of an overlying Tantalum layer by approximately 99%.

In the embodiment of FIG. 6, the gate oxide regions 618 are displayed partially within the depth of the p-type Silicon substrate, and disposed beneath a gate electrode layer 619. In this embodiment, a Poly/Gate mask step was used to define a shielding element. This process step first involves growing a thin layer of oxide 618 that will serve as part of a transistor gate. The gate oxide 618 growth begins at the surface of the die 604, and develops both into and above the substrate. The growth of oxide layer 618 is followed by the deposition of a gate electrode (preferably Poly) layer 619, further followed by a Poly/Gate mask allowing etching away of the gate oxide and Poly layers where no transistor gate is required. The oxide 618 electrically isolates the Poly regions 619 from the p-type Silicon substrate 604 below. The regions of the die 604 not covered by the Poly/gate oxide layers receive n doping and act as drain and source regions in N-MOS transistors. Of course, the opposite result (P-MOS transistor) is equally possible, and can be used in these embodiments.

It is observed that the choice of gate oxide and Poly in this embodiment is somewhat arbitrary—any system that electrically isolates components could be used.

The addition of Poly to the shielding element in this case is due to the manufacturing process used. Because gate oxide (Silicon Oxide) is a natural material to electrically insulate regions of the print head, the shielding element formed by gate oxide regions 618 and the underlying p type Silicon was created at the same time, using the same etching and masking procedure as the transistor gates themselves. It will be recognized that the addition of Poly to the shielding element is therefore unnecessary for practicing the invention.

The addition of Poly layer 619, as in FIG. 6, may also introduce complications. As in FIG. 6, transistors could be defined by external source regions 612, interior n doped Silicon region 664 (now the drain region) and gates defined by gate oxide regions 618 and Poly regions 619. If sufficient charge builds up in the Poly regions 619, the transistors can activate, increasing charge conductance in the die 604 underlying the gate oxide barrier 618, and nullifying the advantage of the shielding element. This can happen if the Poly regions 619 are electrically isolated such that charge can accumulate without possibility to dissipate. The problem may be alleviated by simply connecting the Poly regions 619 to a charge sink, such as ground.

Figure 7:
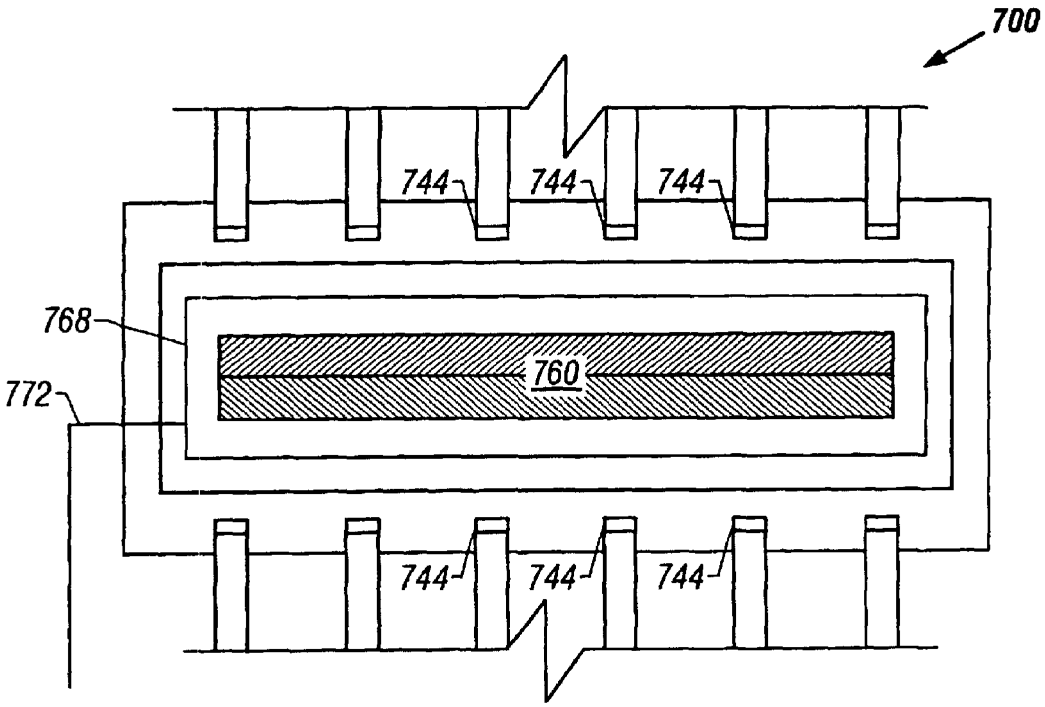
FIG. 7 is one embodiment of a plan view of a portion of an exemplary slot fed print head.

FIG. 7 is a plan view of a portion of an exemplary slot fed print head 700. The portion of print head 700 has an ink slot pre-drill etch region 760 bordered by inkjet firing chambers 744, a Poly+gate oxide shielding element 768, and a charge dissipating element 772. The print head 700 is thus at the stage of the embodiments of FIGS. 5 and 6, after a Silicon pre-etch has occurred, but prior to drilling.

The slot fed print head 700 is similar to that described with reference to FIG. 4, except it is illustrated before drilling, and in that a shielding element 768 has been introduced. The shielding element 768 surrounds the entire region of the Silicon pre-drill etch 760, such that that region is electrically isolated within the die. A charge dissipating element 772, which is simply a line of Poly and gate oxide connecting the Poly ring to ground to prevent transistor firing, is also provided.

In an embodiment where the shielding element 768 of FIG. 7 serves no purpose other than to electrically isolate the slot pre-drill etch region 760 during process, it does not matter whether subsequent drilling of a slot breaks part of the shielding element 768, allowing relatively conductive ink to fill the broken void. In such a case, the shielding element would only substantially enclose the slot pre-drill etch region 760 after construction of slot fed print head 700, but would completely enclose slot fed print head 700 during the Silicon etch phase. If, however, shielding element 768 serves a purpose in the logic of slot fed print head 768, however, such breakage in the drilling phase may not be acceptable.

A preferred embodiment reflecting that in FIG. 7 uses a Poly and gate oxide ring approximately 25 microns wide, with the Poly having a thickness of about 3600 Angstroms and the gate oxide having a thickness of about 700 Angstroms. The width of the shielding element 768 can vary. Usually, the wider the shielding element, the wider the resistive substrate (lightly or non-doped substrate) layer beneath, and the greater the electrical isolation afforded. No minimum effective width is known, but conventional processing techniques typically have a minimum x-y resolution that is not easily reducible. The thickness of the gate oxide can also vary. Conversely, the thinner the gate oxide, the less effective it is. Of course, if the shielding element is also used as a functional element of circuit logic, there will be considerations other than electrical isolation that play into the decision regarding gate oxide thickness.

In principle, any material can be used to electrically isolate a problematic region if such material prevents relatively conductive material in the problematic region from coming "near" (in an electrical sense) to relatively conductive material in the rest of the die. For instance, Silicon nitride, boro-phospho-silicate glass (BPSG), and phosphosilicate glass (PSG) are commonly used dielectric materials and could be used to produce a shielding element, so long as they create an open circuit or introduce a high resistance element in the path of an otherwise conductive layer or structure.

It will be clear from this disclosure that a number of different processing approaches can be used to isolate a sensitive or problematic region using a shielding element, and that sensitive or problematic regions can occur for a variety of processing related reasons. To isolate such regions, changes in the processing order of typical multilayer integrated circuits may be undertaken, so long as the end result is a problematic region that is electrically isolated from surrounding regions. Electrical isolation may include the direct insertion of insulating material, the removal of conductive material, or the blocking of the creation of conductive material.

To achieve the advantages of the present invention, it will not be necessary in certain circumstances to use a ring form as in FIG. 7. For example, a shielding element may be a simple line, closing a charge carrying peninsula, a horizontal layer, shielding vertical charge conductance, or even a rounded three dimensional structure affecting multiple layers. Shielding elements may be used in conjunction with other shielding elements of other shapes, and can ideally also serve functional purposes in the final integrated circuit.

The invention has been described in an exemplary fashion, by means of embodiments that may be readily understood with the teachings of the present disclosure. This is not to imply that the inventions are limited to these embodiments. Rather, the techniques and devices of the present invention are envisioned to be useful wherever the electrochemical isolation of one element or layer of an integrated circuit will aid in the manufacturing of other elements or layers. The invention is not intended to be limited by the exemplary description of the disclosure, but rather only by the following claims.

What is claimed is:

1. A process of making a multi-layered integrated circuit, comprising the steps of:

forming, at a surface of a semiconductor die, at least an insulating layer;

etching at least said insulating layer thereby forming a surface with a first semiconductor area separated from a second semiconductor area by an unbroken insulating area;

doping the surface, such that said surface includes a first doped semiconductor area in the first semiconductor area electrically isolated from a second doped semiconductor area in the second semiconductor area by the unbroken insulator area;

etching a trough in the surface of the first semiconductor area; and forming a slot in the trough, the slot extending through the semiconductor die.

2. The process of claim 1 wherein the unbroken insulating area extends around the first doped semiconductor area.

3. The process of claim 1 wherein said forming, at a surface of a semiconductor die, at least an insulating layer comprises growing a gate oxide layer.

4. The process of claim 3 wherein said forming, at a surface of a semiconductor die, at least an insulating layer further comprises depositing a gate electrode layer.

5. The process of claim 4 further comprising depositing a tantalum cavitation layer.

6. The process of claim 4 further comprising treating said first doped semiconductor area with at least TMAH.

* * * * *

UNITED STATES PATENT AND TRADEMARK OFFICE

CERTIFICATE OF CORRECTION

PATENT NO. : 6,740,536 B2
DATED : May 25, 2004
INVENTOR(S) : Dodd et al.

It is certified that error appears in the above-identified patent and that said Letters Patent is hereby corrected as shown below:

<u>Title page,</u>
Item [56], References Cited, U.S. PATENT DOUMENTS, please add the following references:

| | | |
|---|---|---|
| -- 5,903,031 | 5/1999 | Yamada et al. |
| 6,072,221 | 6/2000 | Hieda |
| 6,107,670 | 8/2000 | Masuda |
| 2002/0125539 | 9/2002 | Oguchi --. |

Signed and Sealed this

Ninth Day of November, 2004

JON W. DUDAS
*Director of the United States Patent and Trademark Office*